US012755942B2

(12) United States Patent
Oh et al.

(10) Patent No.: US 12,755,942 B2
(45) Date of Patent: Oct. 6, 2026

(54) APPARATUS FOR CONDUCTING PLASMA SURFACE TREATMENT, BOARD TREATMENT SYSTEM HAVING THE SAME, AND METHOD OF MANUFACTURING SEMICONDUCTOR DEVICES USING THE SAME

(71) Applicant: Samsung Electronics Co., Ltd., Suwon-si (KR)

(72) Inventors: Junyoung Oh, Seoul (KR); Jaeho Kwak, Osan-si (KR); Boeun Jang, Hwaseong-si (KR); Seokyeon Hwang, Yongin-si (KR); Yongseok Seo, Seoul (KR); Sangsoo Kim, Cheonan-si (KR); Seunghwan Kim, Anyang-si (KR); Jongho Park, Daejeon (KR); Yongkwan Lee, Hwaseong-si (KR); Jongho Lee, Hwaseong-si (KR); Daewook Kim, Osan-si (KR); Wonpil Lee, Yongin-si (KR); Changkyu Choi, Yongin-si (KR)

(73) Assignees: SAMSUNG ELECTRONICS CO., LTD., Suwon-si (KR); New Power Plasma Co., LTD., Pyeongtaek-si (KR)

( * ) Notice: Subject to any disclaimer, the term of this patent is extended or adjusted under 35 U.S.C. 154(b) by 557 days.

(21) Appl. No.: 18/217,043

(22) Filed: Jun. 30, 2023

(65) Prior Publication Data

US 2023/0343560 A1 Oct. 26, 2023

Related U.S. Application Data

(63) Continuation of application No. 16/883,392, filed on May 26, 2020, now Pat. No. 11,728,142.

(30) Foreign Application Priority Data

Aug. 29, 2019 (KR) ........................ 10-2019-0106335

(51) Int. Cl.
*H01J 37/32* (2006.01)
*C23C 16/455* (2006.01)
(Continued)

(52) U.S. Cl.
CPC .. *H01J 37/32449* (2013.01); *C23C 16/45504* (2013.01); *C23C 16/45589* (2013.01);
(Continued)

(58) Field of Classification Search
CPC ........ C23C 16/45502; C23C 16/45504; C23C 16/45589; C23C 16/45591;
(Continued)

(56) References Cited

U.S. PATENT DOCUMENTS

| | | | |
|---|---|---|---|
| 4,134,425 | A | 1/1979 | Gussefeld et al. |
| 4,478,174 | A | 10/1984 | Ranger |

(Continued)

FOREIGN PATENT DOCUMENTS

| | | | |
|---|---|---|---|
| JP | 4550507 | B2 | 9/2010 |
| JP | 2011228404 | A | 11/2011 |

(Continued)

OTHER PUBLICATIONS

Office Action dated May 27, 2024 from the Korean Intellectual Property Office (KIPO) for Korean Patent Application No. 10-2019-0106335.

*Primary Examiner* — Benjamin Kendall
(74) *Attorney, Agent, or Firm* — Muir Patent Law, PLLC

(57) ABSTRACT

A surface treatment apparatus and a surface treatment system having the same are disclosed. The surface treatment apparatus includes a process chamber in which the surface treatment process is conducted, a plasma generator for generating process radicals as a plasma state for the surface treatment process, the plasma generator being positioned outside of the process chamber and connected to the process (Continued)

chamber by a supply duct, a heat exchanger arranged on the supply duct and cooling down temperature of the process radicals passing through the supply duct and a flow controller controlling the process radicals to flow out of the process chamber. The flow controller is connected to a discharge duct through which the process radicals are discharged outside the process chamber. The plasma surface treatment process is conducted to the package structure having minute mounting gap without the damages to the IC chip and the board.

20 Claims, 9 Drawing Sheets

(51) Int. Cl.
*C23C 16/458* (2006.01)
*H10P 72/10* (2026.01)

(52) U.S. Cl.
CPC .. *H01J 37/32633* (2013.01); *C23C 16/45502* (2013.01); *C23C 16/45591* (2013.01); *C23C 16/4583* (2013.01); *H01J 37/32357* (2013.01); *H10P 72/15* (2026.01)

(58) Field of Classification Search
CPC ........ C23C 16/4583; H01J 37/32–3299; H10P 72/0402; H10P 72/15; H01L 21/67017; H01L 21/67326
See application file for complete search history.

(56) References Cited

U.S. PATENT DOCUMENTS

| | | | | |
|---|---|---|---|---|
| 5,262,610 | A * | 11/1993 | Huang | H01J 37/32357 204/298.31 |
| 5,415,585 | A | 5/1995 | Miyagi | |
| 6,045,671 | A | 4/2000 | Wu et al. | |
| 6,352,593 | B1 * | 3/2002 | Brors | C23C 16/44 118/724 |
| 7,381,291 | B2 | 6/2008 | Tobe et al. | |
| 7,662,232 | B2 | 2/2010 | Kobayashi et al. | |
| 8,387,563 | B2 | 3/2013 | Endo et al. | |
| 8,397,668 | B2 | 3/2013 | Kobayashi et al. | |
| 8,636,871 | B2 | 1/2014 | Sawada et al. | |
| 8,733,282 | B2 | 5/2014 | Kobayashi et al. | |
| 9,018,111 | B2 | 4/2015 | Milligan et al. | |
| 9,038,567 | B2 | 5/2015 | Kobayashi et al. | |
| 9,184,028 | B2 | 11/2015 | Dhindsa et al. | |
| 9,216,609 | B2 | 12/2015 | Inoue et al. | |
| 2002/0036066 | A1 * | 3/2002 | Ogawa | H01J 37/3244 257/E21.252 |
| 2003/0075273 | A1 | 4/2003 | Kilpela et al. | |
| 2004/0157430 | A1 | 8/2004 | Mandal | |
| 2005/0287806 | A1 * | 12/2005 | Matsuura | C23C 16/36 257/E21.293 |
| 2006/0016559 | A1 | 1/2006 | Kobayashi et al. | |
| 2006/0037700 | A1 * | 2/2006 | Shi | H10P 50/287 156/345.43 |
| 2008/0173238 | A1 | 7/2008 | Nakashima et al. | |
| 2008/0178805 | A1 * | 7/2008 | Paterson | H01J 37/321 118/723 R |
| 2014/0041585 | A1 | 2/2014 | Hsu et al. | |
| 2016/0289834 | A1 | 10/2016 | Je et al. | |
| 2020/0052874 | A1 | 2/2020 | Itou | |

FOREIGN PATENT DOCUMENTS

| | | | |
|---|---|---|---|
| KR | 100452920 | B1 | 10/2004 |
| KR | 20060023430 | A | 3/2006 |
| KR | 100672696 | B1 | 1/2007 |
| KR | 100739959 | B1 | 7/2007 |
| KR | 1020040063893 | B1 | 2/2010 |
| KR | 20100069392 | A | 6/2010 |
| KR | 101439878 | B1 | 9/2014 |
| KR | 101470865 | B1 | 12/2014 |
| KR | 101535155 | B1 | 7/2015 |

* cited by examiner

APPARATUS FOR CONDUCTING PLASMA SURFACE TREATMENT, BOARD TREATMENT SYSTEM HAVING THE SAME, AND METHOD OF MANUFACTURING SEMICONDUCTOR DEVICES USING THE SAME

CROSS-REFERENCE TO RELATED APPLICATIONS

This application is a continuation of U.S. application Ser. No. 16/883,392 filed May 26, 2020 which claims priority under 35 U.S.C § 119 to Korean Patent Application No. 10-2019-0106335 filed on Aug. 29, 2019 in the Korean Intellectual Property Office, the contents of each of these application being incorporated by reference herein in its entirety.

BACKGROUND

1. Field

Example embodiments relate to an apparatus for conducting a plasma surface treatment, a board treatment system having the same and a method of conducting a plasma surface treatment using the same, and more particularly, to an apparatus for conducting an indirect plasma surface treatment, a board treatment system having the same and a method of conducting a plasma surface treatment using the same. Some example embodiments relate to a method of manufacturing semiconductor devices and/or electronic devices using the aforementioned apparatus and/or the aforementioned method.

2. Description of the Related Art

A surface treatment have been widely used in a semiconductor package field for removing impurities from surfaces of the integrated circuit (IC) chip and the circuit board and, as a result, for improving the attachment force among the IC chip, the circuit board and the mold.

Particularly, plasma surface treatment has been intensively used for removing impurities from surfaces of integrated circuit (IC) chips and circuit boards and for forming dangling bonds on the surfaces of the IC chips and the circuit boards.

In a direct plasma surface treatment process, a circuit board on which IC chips are bonded is loaded into a process chamber for conducting a surface treatment process. A process plasma is generated in the process chamber and a plasma surface treatment is conducted to the surfaces of the IC chips and the circuit board. Thus, the IC chip and the circuit board of the semiconductor package are directly exposed to the high temperature plasma ions and/or radicals.

The direct plasma surface treatment process may improve the uniformity of the surface treatment. However, power increase or pressure reduction of the direct plasma surface treatment process for improving the process efficiency may cause chip damages due to a temperature increase of the plasma ions, which may cause performance deterioration and/or defects of the semiconductor package.

Therefore, power increase is inherently limited in the direct plasma surface treatment process and, as a result, concentration of the plasma ions is also limited in a predetermined range in the process chamber. Accordingly, improvement of the process efficiency is limited in the direct plasma surface treatment process.

Particularly, mounting gap spaces between IC chips and circuit boards tend to be downsized in recent package trends. Thus, surface treatments to the surfaces of the IC chips and the circuit boards in the downsized mounting gap spaces require a high concentration of plasma ions. However, power raise for increasing the concentration of the plasma ions may cause the temperature increase of the plasma ions, and may cause IC chip damages.

SUMMARY

Example embodiments of the present inventive concept provide an apparatus for conducting an indirect plasma surface treatment process (referred to as surface treatment apparatus hereinafter) in which low temperature plasma is sufficiently supplied into a minute mounting gap space in parallel with the circuit board to conduct the plasma treatment to the surfaces of the integrated circuit (IC) chip and the circuit board around the minute mounting gap space.

Other example embodiments of the present inventive concept provide a surface treatment system having the above surface treatment apparatus.

Other example embodiments of the present inventive concept provide a method of conducting a plasma surface treatment in the above surface treatment apparatus.

According to exemplary embodiments of the inventive concept, there is provided a surface treatment apparatus including a process chamber configured that the surface treatment process is conducted to a package structure, a plasma generator configured to generate process radicals as a plasma state for the surface treatment process, the plasma generator being positioned outside of the process chamber and connected to the process chamber by a supply duct, a heat exchanger arranged on the supply duct and configured to cool down temperature of the process radicals passing through the supply duct, and a flow controller configured to control the process radicals to flow out of the process chamber, the flow controller being connected to a discharge duct configured that the process radicals are discharged outside the process chamber through the discharge duct.

According to exemplary embodiments of the inventive concept, there is provided a surface treatment system including a bonding apparatus configured to bond an integrated circuit (IC) chip to a circuit board to thereby provide a package structure, a surface treatment apparatus configured to conduct a plasma surface treatment process to the package structure, and a molding apparatus configured to form a mold structure on the circuit board and the IC chip and to encapsulate the IC chip. In such a case, the surface treatment apparatus includes a process chamber configured that the surface treatment process is conducted to the package structure in the process chamber, a plasma generator configured to generate process radicals as a plasma state for the surface treatment process, the plasma generator being positioned outside of the process chamber and connected to the process chamber by a supply duct, a heat exchanger arranged on the supply duct and configured to cool down temperature of the process radicals passing through the supply duct, and a flow controller configured to control the process radicals to flow out of the process chamber, the flow controller being connected to a discharge duct configured that the process radicals are discharged outside the process chamber through the discharge duct.

According to exemplary embodiments of the inventive concept, there is provided a method of manufacturing a semiconductor device. At first, a plurality of package structures may be loaded to a process chamber having first and second walls spaced apart in a first direction and a supply baffle and a discharge baffle adjacent to the first and the second walls, respectively, and the supply and discharge baffles extending in a second direction perpendicular to the first direction. The supply baffle may have a plurality of inlet holes and the discharge baffle may have a plurality of outlet holes. Then, process radicals generated from an exterior plasma generator may be supplied into the process chamber through the inlet holes. Then, a plasma surface treatment process may be conducted to surfaces of the package structures with the process radicals. Thereafter, the process radicals may be discharged from the process chamber through the outlet holes. The package structures may be stacked in a third direction perpendicular to the first and second directions while the plasma surface treatment is performed.

According to example embodiments of the present inventive concept, the process plasma may be generated outside of the process chamber and may be supplied to the process chamber via the supply duct under the process temperature at a controlled flow rate sufficiently for treating the surfaces of the minute mounting gap. The temperature of the process radicals may be reduced to the process temperature by a cooler enclosing the supply duct, to thereby minimize the damages to the package structure in the plasma surface treatment process. The temperature and the flux of the process radicals may be accurately controlled for minimizing the damages to the package structure in the plasma surface treatment process.

For example, the low temperature process radicals R may be supplied into the process chamber at an amount sufficiently conducting the surface treatment process to surfaces of the minute mounting gap of the package structure. Thus, the surfaces of the package structure having the minute mounting gap may be sufficiently treated by the plasma surface treatment process without substantial damages to the chip and the circuit board.

Further, the supply baffle may be arranged around the supply duct in the process chamber and a plurality of the inlet hole rows is arranged at the same gap along the height of the process chamber, so that the process radicals may be supplied into the treatment space of the process chamber uniformly along the height of the process chamber. In addition, the discharge baffle may be arranged around the discharge duct in the process chamber and a plurality of the outlet hole rows is arranged at the same gap along the height of the process chamber, so that the process radicals may be discharged from the treatment space of the process chamber uniformly along the height of the process chamber. Therefore, the plasma surface treatment process may be uniformly and simultaneously conducted to a plurality of the package structures PS in the process chamber.

BRIEF DESCRIPTION OF THE DRAWINGS

These and other features of the inventive concept will become more apparent by describing in detail exemplary embodiments thereof with reference to the accompanying drawings of which.

DETAILED DESCRIPTION OF THE EMBODIMENTS

Figure 1:
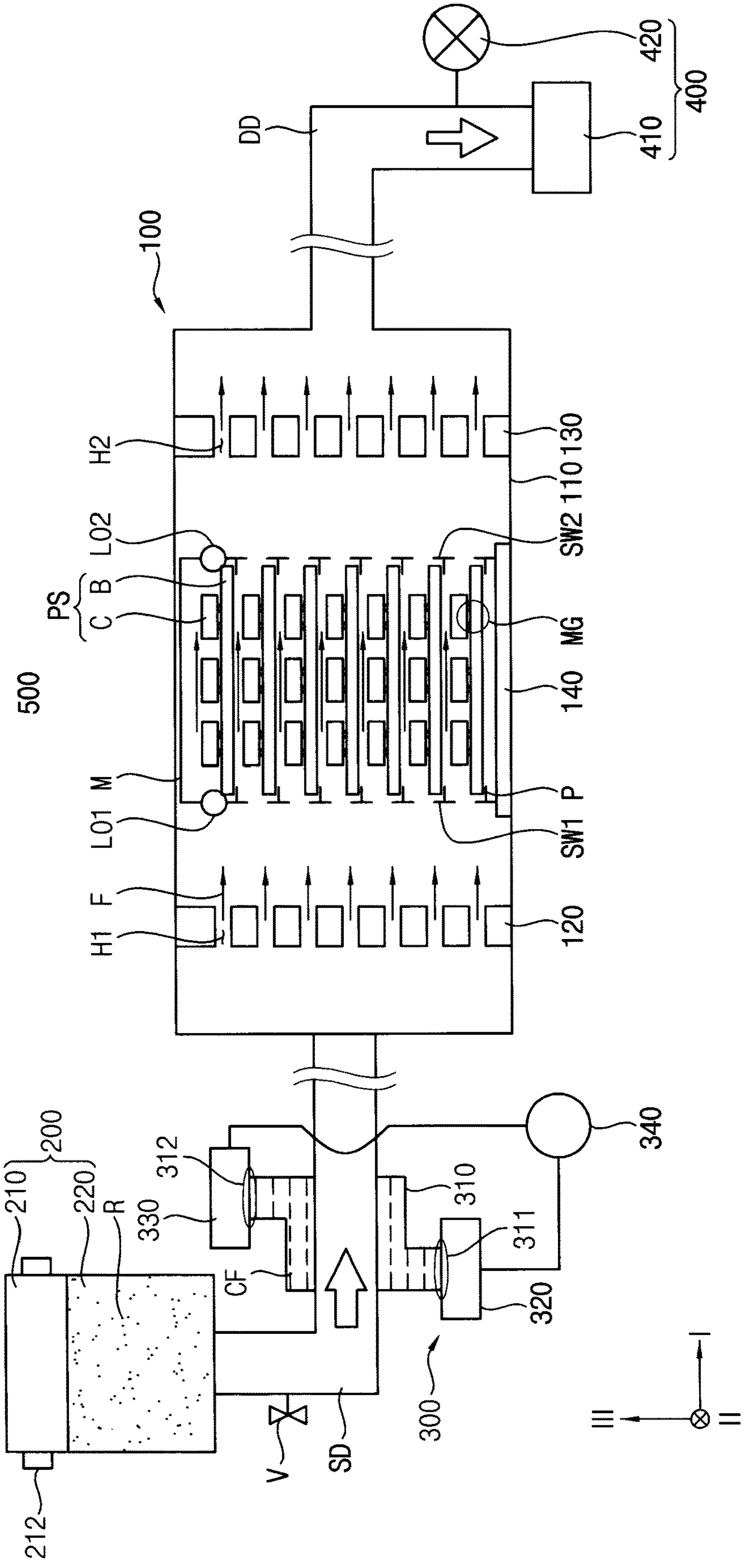
FIG. 1 is a structural view illustrating a structure of a plasma surface treatment apparatus in accordance with an example embodiment of the present inventive concept.

Reference will now be made to example embodiments, which are illustrated in the accompanying drawings, wherein like reference numerals may refer to like components throughout.

Figure 2:
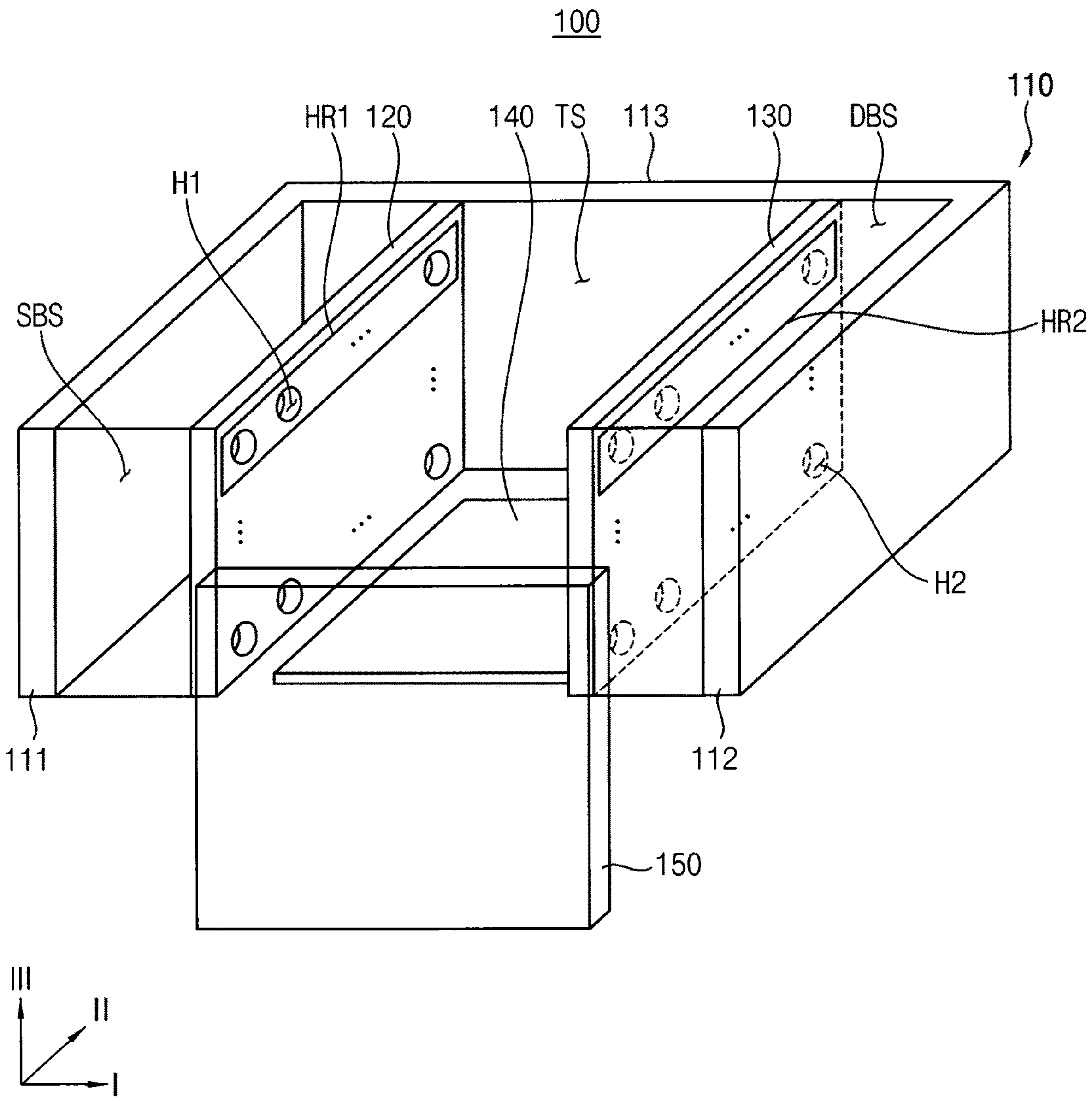
FIG. 2 is a perspective view illustrating a process chamber of the plasma surface treatment apparatus shown in FIG. 1 in accordance with an example embodiment of the present inventive concept.
Figure 3:
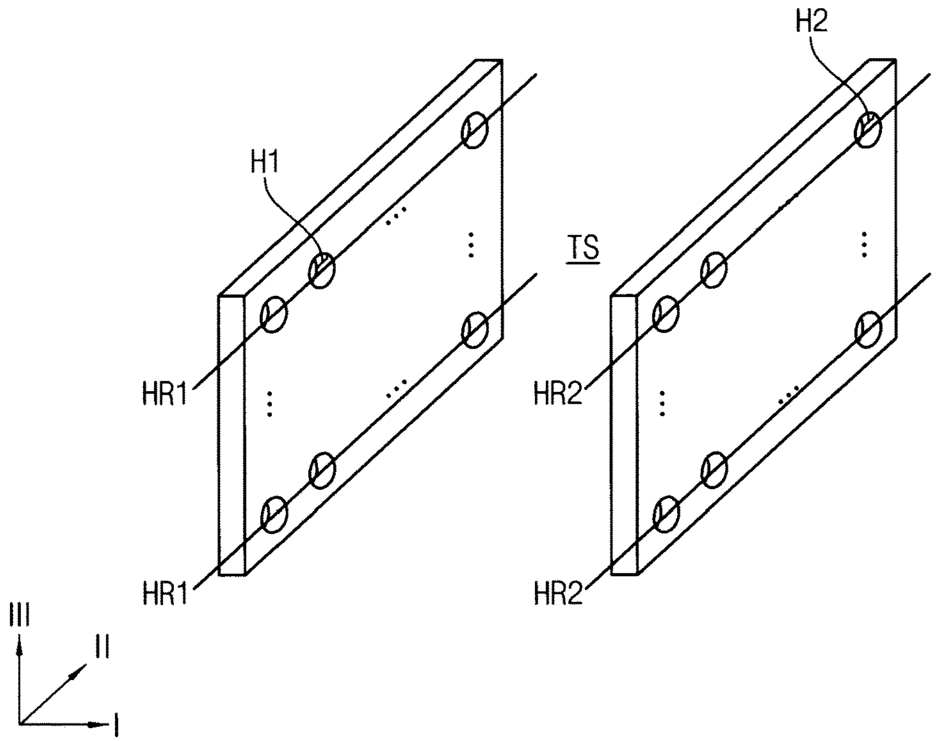
FIG. 3 is a perspective view illustrating a supply baffle and a discharge baffle of the plasma surface treatment apparatus shown in FIG. 1.

FIG. 1 is a structural view illustrating a structure of a plasma surface treatment apparatus in accordance with an example embodiment of the present inventive concept. FIG. 2 is a perspective view illustrating a process chamber of the plasma surface treatment apparatus shown in FIG. 1 in accordance with an example embodiment of the present inventive concept. FIG. 3 is a perspective view illustrating a supply baffle and a discharge baffle of the plasma surface treatment apparatus shown in FIG. 1. FIGS. 4A to 4D are side views illustrating supply holes of the supply baffle shown in FIG. 3.

Referring to FIGS. 1 to 4D, a surface treatment apparatus 500 in accordance with an example embodiment of the present inventive concept may include a process chamber 100 in which a surface treatment process may be conducted, a plasma generator 200 positioned at an exterior/outside of the process chamber and generating a process plasma for the surface treatment process, a cooler 300 cooling the temperature of the process plasma and a fluid controller 400 for controlling the process plasma to discharge the process plasma from the process chamber 100. The fluid controller 400 may control speed and/or amount of a flowing fluid, and the fluid controller 400 may be called as a flow controller. The process plasma may include the plasma of source gases for the surface treatment and may be provided as plasma ions or radicals. For that reason, the process plasma may be referred to as process radicals for conducting the surface treatment process.

For example, the process chamber 100 may be spaced apart from the plasma generator 200 and the process radicals may be supplied into the process chamber 100 through a supply duct SD. The process radicals may flow into the process chamber 100 in a uniform flow direction F through the supply duct SD. For example, the process chamber 100 may be connected with the plasma generator 200 via the supply duct SD. For example, the uniform flow may be a horizontal flow of the process radicals without substantial eddy flow.

In the present example embodiment, the process chamber 100 may include a body 110, a supply baffle 120, a discharge baffle 130 and a holder 140 for holding a package structure PS to which the plasma surface treatment may be conducted/performed.

The body 110 may include a first wall 111 and a second wall 112 having a height corresponding to the height of the body 110 in a third direction III and extending in a second direction II substantially perpendicular to the third direction III having a length corresponding to the length of the body 110 and spaced apart from each other in a first direction I substantially perpendicular to the second direction II and the third direction III. The supply duct SD may be connected to the first wall 111 and a discharge duct DD may be connected to the second wall 112. A rear wall 113 may extend in the first direction I and be connected to rear portions (e.g., rear ends or rear end portions) of the first and the second walls 111 and 112 at a rear portion of the process chamber 100. The length of the rear wall 113 may be defined as a width of the body 110. Thus, the body 110 may be shaped into a box having the height in the third direction III, the length in the second direction II and the width in the first direction I.

Embodiments may be illustrated herein with idealized views (although relative sizes may be exaggerated for clarity). It will be appreciated that actual implementation may vary from these exemplary views depending on manufacturing technologies and/or tolerances. Therefore, descriptions of certain features using terms such as "same," "equal," and geometric descriptions such as "planar," "coplanar," "cylindrical," "square," etc., as used herein when referring to orientation, layout, location, shapes, sizes, amounts, or other measures, encompass acceptable variations from exact identicality, including nearly identical layout, location, shapes, sizes, amounts, or other measures within acceptable variations that may occur, for example, due to manufacturing processes. The term "substantially" may be used herein to emphasize this meaning, unless the context or other statements indicate otherwise.

A front portion of the body 110 opposite to the rear wall 113 may be opened and the package structure PS may be loaded into the process chamber 100 through the open front portion of the body 110. For example, a gate 150 may be provided at the front portion of the body 110, thus the front portion of the body 110 may be selectively opened or closed by the gate 150. In initiating the surface treatment process, the gate 150 may be opened and the package structure PS may be loaded into the process chamber 100. When the package structure PS is sufficiently loaded into the process chamber 100, the gate 150 may be closed and the inner space of the process chamber 100 may be closed/isolated from surroundings. When the plasma surface treatment is completed, the gate 150 may be opened again and the package structure PS may be unloaded from the process chamber 100. A package structure PS as used herein may be a semiconductor package including one or more semiconductor chips are mounted on a circuit board or on another substrate.

In the present example embodiment, the package structure PS may include a board structure in which at least one IC chip C is bonded to a circuit board B. In such a case, a semiconductor package included in the board structure may undergo the plasma surface treatment in the process chamber 100. For example, the one IC chip C may be included in the semiconductor package.

A plurality of the package structures PS may be stacked one by one in a package transfer such as a magazine M and may be transferred to the surface treatment apparatus 500. Then, the magazine M itself may be loaded into the process chamber 100, thus the surface treatment process may be simultaneously conducted to the plurality of the package structures PS in the magazine M. For example, the package structures may be semiconductor packages or the package structures may include substrates and semiconductor chips mounted on the substrates.

The supply duct SD may be connected to the first wall 111 and the discharge duct DD may be connected to the second wall 112. As will be described in detail hereinafter, the supply duct SD may be connected to the plasma generator 200 spaced apart from the process chamber 100. Thus, the process radicals R may be generated at an exterior/outside of the process chamber 100 and may flow into the process chamber 100 via the supply duct SD. When the surface treatment process is completed, the process plasma may be discharged from the process chamber 100 via the discharge duct DD connected to the second wall 112.

The supply baffle 120 may be arranged apart from the first wall 111 in such a configuration that a supply buffer space SBS may be provided between the first wall 111 and the supply baffle 120. The process radicals R may be cooled down by the cooler 300 and the cool radicals R may be stacked/concentrated/stored in the supply buffer space SBS. For example, the cooler 300 may be a heat exchanger configured to cool down the plasma/radicals by means of heat exchange between the plasma/radicals and a fluid included in the heat exchanger. The discharge baffle 130 may be arranged apart from the second wall 112 in such a configuration that a discharge buffer space DBS may be provided between the second wall 112 and the discharge baffle 130. The process radicals R flowing through the magazine M having the plurality of the package structure PS may flow into the discharge buffer space DBS through the discharge baffle 130 and may be stacked/gathered in the discharge buffer space DBS. Thereafter, the process radicals R may be discharged from the process chamber 100 through the discharge duct DD. An inner space of the process chamber between the supply baffle 120 and the discharge baffle 130 may be provided as a treatment space TS in which the plasma surface treatment may be conducted to the package structure PS.

The supply baffle 120 and the discharge baffle 130 may include a vertical plate extending in the third direction III and contact with a bottom (not shown) and a ceiling (not shown) of the body 110. For example, the body 110 may include the bottom and the ceiling being in contact with the supply baffle 120 and the discharge baffle 130. For example, the body 110 may be an outer body of the process chamber 100.

The supply baffle 120 and the discharge baffle 130 may be sufficiently connected to the first wall, 111, the second wall 112, the rear wall 113, the front wall (not shown), the bottom and the ceiling with high sealing degree, so that the supply buffer space SBS, the treatment space TS and the discharge buffer space DBS may be sufficiently sealed from each other in the process chamber 100. Thus, the process radicals R may flow in the process chamber 100 only through the inlet holes H1 and outlet holes H2, as will be described in detail hereinafter.

A plurality of the inlet holes H1 may be arranged on the surface of the supply baffle 120 and a plurality of the outlet holes H2 may be arranged on the surface of the discharge baffle 130. For example, the inlet holes H1 may pass through the supply baffle 120 in the first direction, and the outlet holes H2 may pass through the discharge baffle 130 in the first direction.

A plurality of the inlet holes H1 may be arranged with the same gap distances along the second direction II and may be provided as an inlet hole row HR1 and a plurality of the inlet hole rows HR1 may be arranged with the same gap distances along the third direction III. For example, the inlet holes H1 in each inlet hole rows HR1 may be arranged in series in the second direction II.

Since the supply buffer space SBS may be sufficiently sealed from the treatment space TS, the process radicals R may flow into the treatment space TS just through the inlet holes H1. As the inlet holes H1 may be arranged into a matrix in which a plurality of the inlet hole rows HR1 may be arranged with the same gap distances along the third direction III, the process radicals R may be uniformly supplied into the treatment space TS through the supply baffle 120.

In the same way, a plurality of the outlet holes H2 may be arranged with the same gap distances along the second direction II and may be provided as an outlet hole row HR2 and a plurality of the outlet hole rows HR2 may be arranged with the same gap distances along the third direction III. For example, the outlet holes H2 in each outlet hole rows HR2 may be arranged in series in the second direction II.

Since the discharge buffer space DBS may be sufficiently sealed from the treatment space TS, the process radicals R may flow into the discharge buffer space DBS from the treatment space TS just through the outlet holes H2. As the outlet holes H2 may be arranged into a matrix in which a plurality of the outlet hole rows HR2 may be arranged with the same gap distances along the third direction III, the process radicals R may be uniformly flow out into the discharge buffer space DBS from the treatment space TS through the discharge baffle 130.

In the present example embodiment, the inlet holes H1 and the outlet holes H2 may be shaped into the same matrix on the supply baffle 120 and the discharge baffle 130, so that the inlet hole row HR1 and the outlet hole row HR2 corresponding to the inlet hole row HR1 may be positioned at the same height in the third direction III. Accordingly, the process radicals R may flow into the discharge buffer space DBS from the supply buffer space SBS substantially at the same height, so that the flow F of the process radicals R may be formed into a uniform flow in the third direction III. For example, flow rate and flow direction of the radicals R may be substantially the same throughout the treatment space TS, which may be beneficial for uniform plasma treatment of the package structure PS.

The configurations of the inlet holes H1 and the outlet holes H2 may be varied in accordance with the requirements of the surface treatment apparatus 500. Hereinafter, the configurations of the holes will be described in detail with respect to the inlet holes H1 of the supply baffle 120. The configurations of the outlet holes H2 may be substantially the same as the inlet holes H1, thus any further detailed descriptions on the outlet holes H2 will be omitted.

Figure 4A:
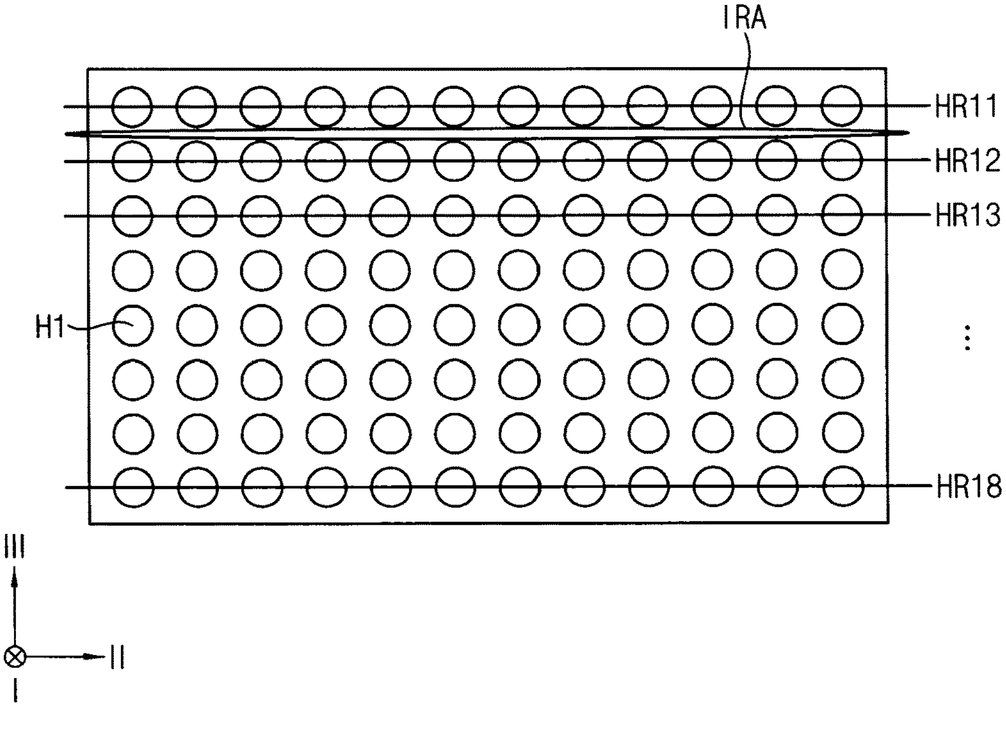
FIGS. 4A to 4D are side views illustrating supply holes of the supply baffle shown in FIG. 3.

As illustrated in FIG. 4A, eight inlet hole rows HR11 to HR18 may be arranged on the surface of the supply baffle 120 at the same gap distances as an example embodiment of the present invention. Since the gap distances of the inlet holes H1 in each of the inlet hole rows HR11 to HR18 are the same and the distances between the inlet hole rows HR11 to HR18 are the same as the distances between the inlet holes H1 in each inlet hole rows, the overall inlet holes H1 may be arranged into a rectangular matrix.

Thus, 96 inlet holes H1 may be uniformly arranged on the surface of the supply baffle 120 thereby penetrating the supply baffle 120, and the process radicals R may be uniformly supplied into the treatment space TS of the process chamber 110 through the uniformly-arranged 96 inlet holes H1.

The arrangement of the inlet holes H1 may be varied according to the behaviors of the process radicals R and the process characteristics of the surface treatment process in order that the process radicals R may uniformly flow into the treatment space TS from the supply buffer space SBS.

Figure 4B:
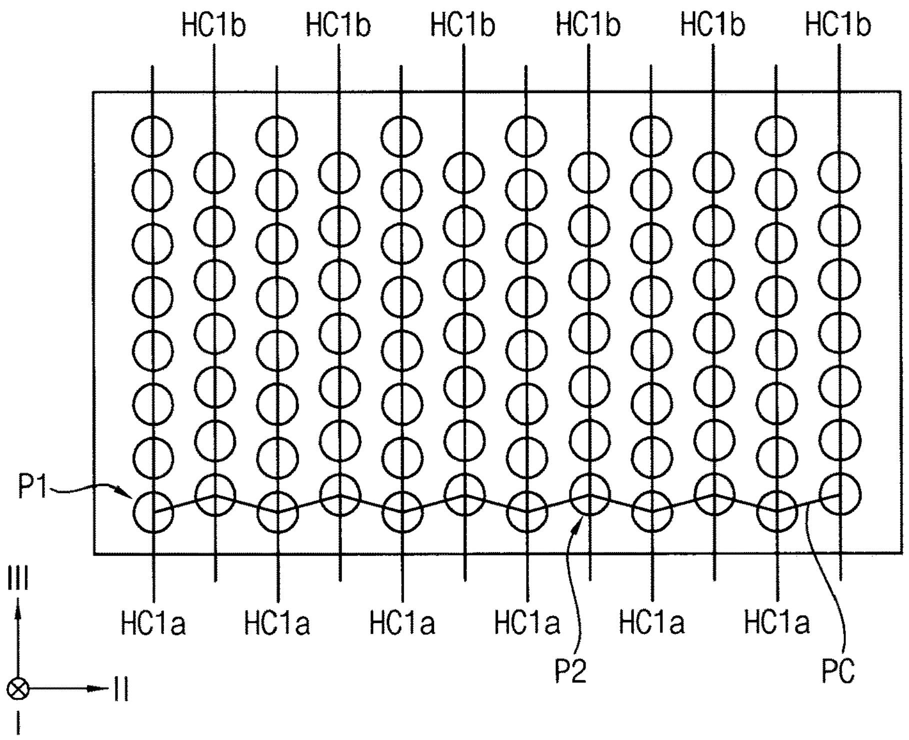

As illustrated in FIG. 4B, the inlet holes H1 may be arranged at the same gap distances in a line along the third direction III and an inlet hole column HC1 (HC1*a* or HC1*b*) may be provided on the surface of and thereby penetrating the supply baffle 120. A plurality of the inlet hole columns HC1 (HC1*a* and HC1*b*) may be arranged in the second direction II in such a configuration that relatively longer columns HC1*a* and relatively shorter columns HC1*b* may be alternately arranged in the second direction II. The inlet holes H1 of the relatively shorter column HC1*b* may be positioned between the neighboring inlet holes H1 of the relatively longer column HC1*a* and may be shifted aside in the third direction III, so that the uppermost inlet hole H1 of the relatively shorter column HC1*b* may be lower than the uppermost inlet hole H1 of the relatively longer column HC1*a* and the lowermost inlet hole H1 of the relatively shorter column HC1*b* may be higher than the lowermost inlet hole H1 of the relatively longer column HC1*a*. Therefore, the supply position of the process radicals R in the relatively longer column HC1*a* may be higher than that of the process radicals R in the relatively shorter column HC1*b*. For example, each of the relatively longer columns HC1*a* may include one more hole than the number of holes H1 formed in the relatively shorter column HC1*b*.

For example, the supply positions of the process radicals R may be alternately changed between relatively lower and higher positions P1 and P2 and the position contour (PC) of the supply positions may be shaped into a saw tooth in the second direction II. The saw-toothed position contour PC of the supply positions of the process radicals R may improve the uniformity of radical concentration in the treatment space TS.

Figure 4C:
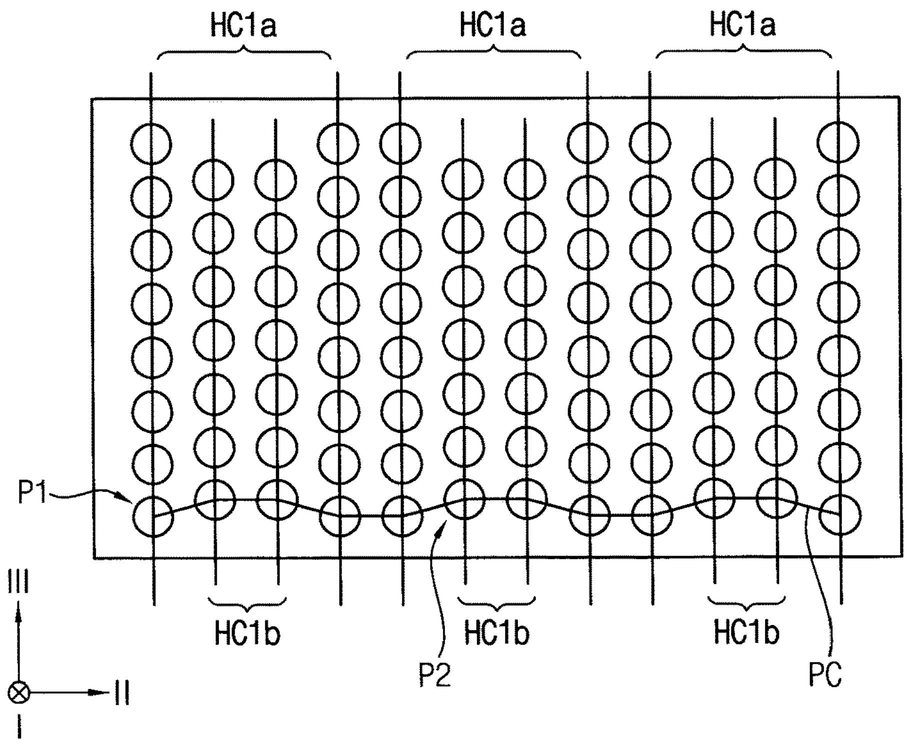

As illustrated in FIG. 4C, a pair of the relatively shortened columns HC1*b* may be arranged between a pair of relatively longer columns HC1*a* in the second direction II. Thus, the position contour (PC) of the supply positions may be shaped into a trapezoid in the second direction II, so that the uniformity of radical concentration may also be improved in the treatment space TS.

Figure 4D:
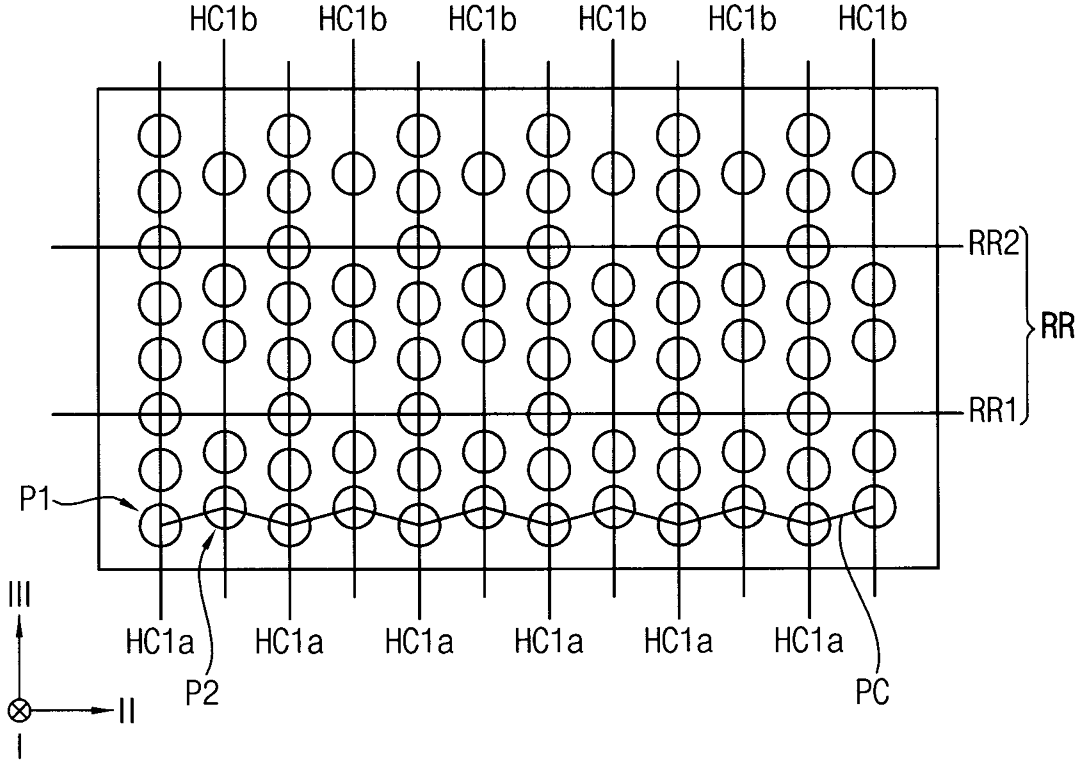

Referring to FIG. 4D, some of the inlet holes H1 may be removed from the relatively shortened columns HC1*b* and the inlet holes H1 in the relatively shortened columns HC1*b* may be non-uniformly arranged in the third direction III and the position contour (PC) of the supply positions may be shaped into a mixture of the saw tooth and a line in the second direction II. For example, the line shaped position contour PC may be repeated in the third direction III and the saw-toothed position contour PC may be interposed between the neighboring line-shaped position contours PC. Thus, the line-shaped position contour PC may be provided as a reference row RR for identifying saw-toothed position contours PC. In the present example embodiment, the reference row RR may include the first row RR1 and the second row RR2 and the supply baffle 120 may be classified into three sections and a plurality of the saw-toothed position contours PC may be arranged in each section of the supply baffle 120. For example, the inlet holes H1 formed in the shortened columns HC1*b* may be irregularly arranged in the third direction, and the inlet holes H1 of the relatively columns HC1*a* may be arranged regularly in the third direction. For example, the closest neighboring inlet holes disposed in the closest neighboring inlet hole columns are disposed in different heights from each other in the third direction. The outlet holes may also be arranged in the same way as the inlet holes.

For example, the configurations of the inlet holes H may be different from one another in the sections of the supply baffle 120. Thus, the uniformity of radical concentration may be different in each section of the supply baffle 120. For example, when the concentration of the process radicals R need to be different or varied in the third direction III in the process chamber 100, the configuration of the inlet holes H1 may be different from one another among the sections of the supply baffle 120.

In a modified example embodiment, the process chamber 100 may further include one or more hole covers 160 covering/blocking at least one of the inlet hole rows HR1 and the discharge hole rows HR2.

Figure 5:
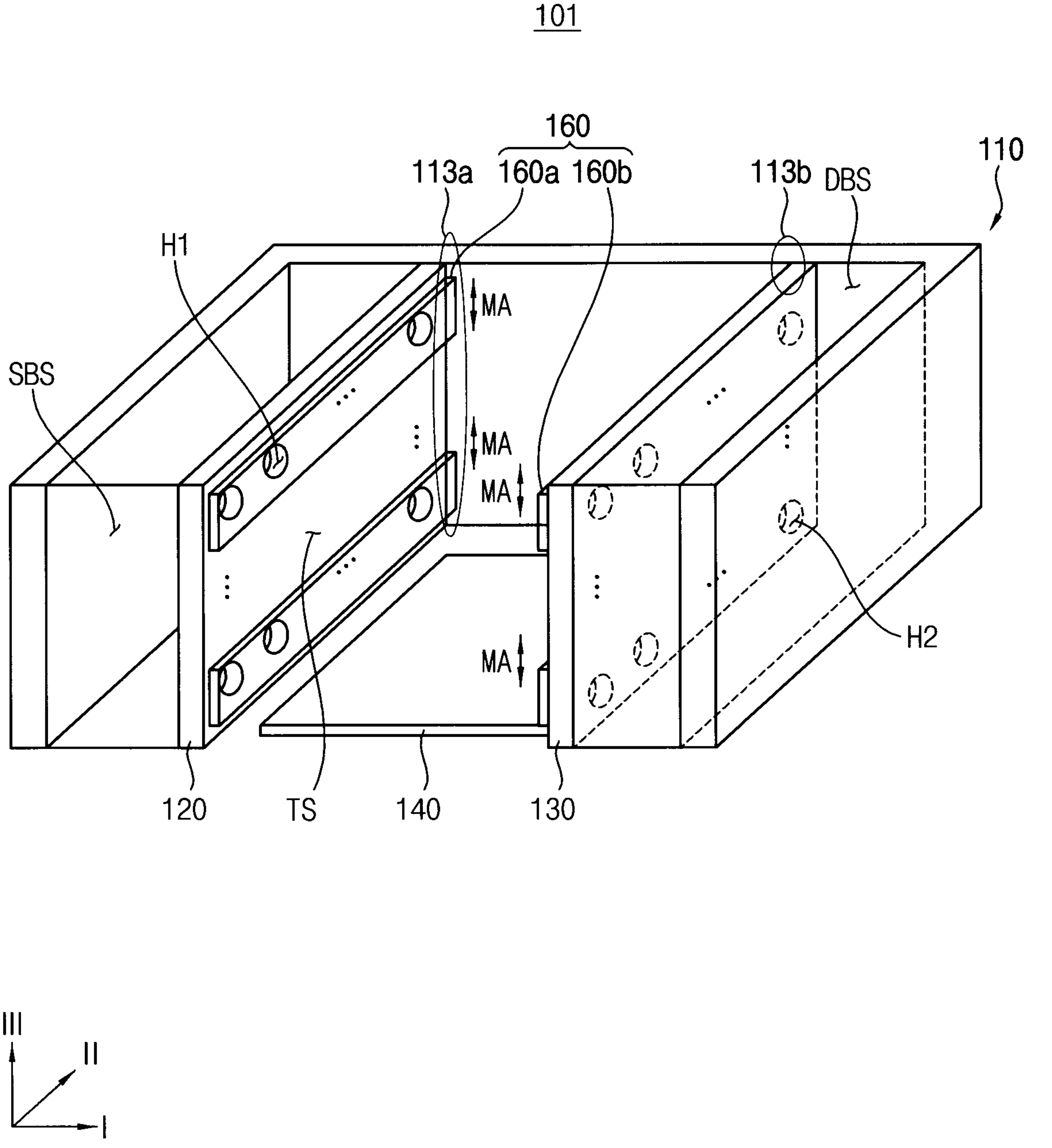
FIG. 5 is a perspective view illustrating the process chamber of the plasma surface treatment apparatus shown in FIG. 1 in accordance with another example embodiment of the present inventive concept.
Figure 6:
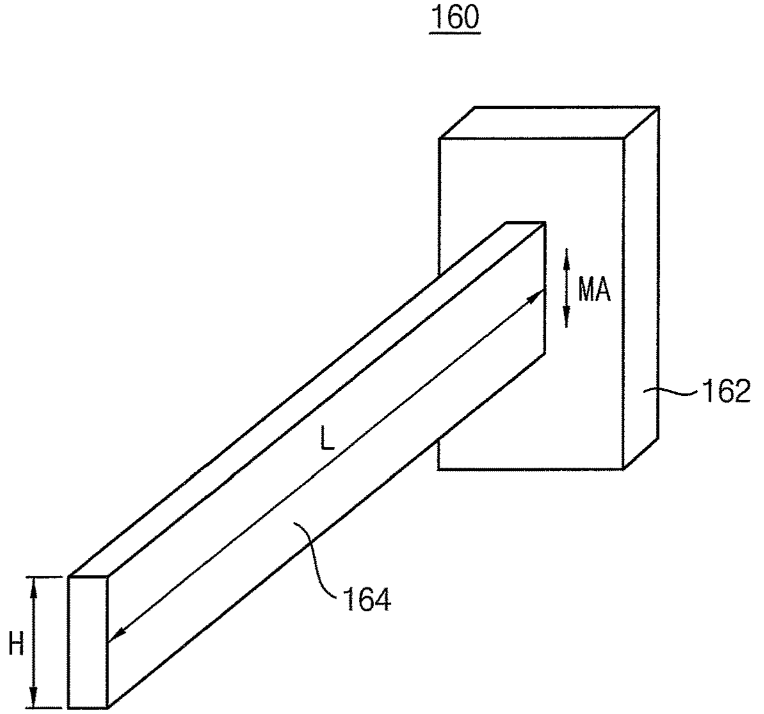
FIG. 6 is a perspective view illustrating a hole cover of the process chamber shown in FIG. 5.

FIG. 5 is a perspective view illustrating the process chamber of the plasma surface treatment apparatus shown in FIG. 1 in accordance with another example embodiment of the present inventive concept. FIG. 6 is a perspective view illustrating a hole cover of the process chamber shown in FIG. 5.

In FIG. 5, the process chamber 101 in accordance with another example embodiment of the present inventive concept has substantially the same structures as the process chamber 100 in FIG. 2, except that hole covers 160 are further provided with the process chamber 101. Thus, in FIG. 5, the same reference numerals denote the same elements as the process chamber 100 in FIG. 2, and any further detailed descriptions on the same elements will be omitted hereinafter.

Referring to FIGS. 5 and 6, at least one hole cover 160 may be arranged on at least one of the supply baffle 120 and the discharge baffle 130 in such way that at least one of the inlet hole rows HR1 and the outlet hole rows HR2 may be covered/blocked by the hole cover 160 and the process radicals R may be selectively prohibited from inflow to the treatment space TS and/or from outflow to the discharge buffer space DBS through the corresponding inlet holes H1 and/or outlet holes H2.

For example, the hole cover 160 may include a cover driver 162 secured to the rear wall 113 and a cover bar 164 extending from the cover driver 162 along the second direction II and covering the inlet hole rows HR1 or the outlet hole rows HR2.

The cover driver 162 may include a linear driver (not shown) conducting linear operation and a driving shaft (not shown) connected to the linear driver. Thus, the driving shaft may move linearly in accordance with the linear operation of the linear driver. For example, the linear driver may include a step motor for an accurate linear control and the cover bar 164 may be connected to the step motor. Thus, the cover bar 164 may linearly move upwards or downwards along the third direction III within a linear motion range MA.

The cover bar 164 may be a slender member extending from the cover driver 162 in the second direction II and having a length corresponding to the length of the supply baffle 120 and/or the discharge baffle 130. Thus, the inlet hole row HR1 and/or the outlet hole row HR2 may be sufficiently covered by the cover bar 164.

The height H of the cover bar 164 may be a half of a row pitch of the inlet hole row HR1 and/or the outlet hole row HR2. Thus, the cover bar 164 may be selectively positioned on the inlet hole row HR1 and/or the outlet hole row HR2 or on an inter-row area IRA in FIG. 4A between the neighboring inlet hole rows HR1 and/or neighboring outlet hole rows HR2. For example, the cover bar 164 may be positioned on the inlet hole row HR1 and/or the outlet hole row HR2 at an interrupt mode at which the flow of the process radicals R may be interrupted/blocked and the process radicals R may not flow into the treatment space TS, while the cover bar 164 is positioned on the inter-row areas IRA at a flow mode at which the flow of the process radicals R may be allowed and the process radicals R may flow into the treatment space TS. For example, the width of the cover bar 164 in the third direction may correspond to the distance between two directly neighboring inlet hole rows (or outlet hole rows) in the third direction and/or may correspond to a width of the inlet hole rows (or the outlet hole rows) in the third direction. In some embodiments, two or more inter-row areas IRA may be formed in each of the supply baffle 120 and the discharge baffle 130. For example, more than two inlet hole rows HR1 and more than two outlet hole rows HR2 may be respectively formed in the supply baffle 120 and the discharge baffle 130.

The holes H of the inlet hole row HR1 and/or the outlet hole row HR2 may have a size corresponding to the height H of the cover bar 164 and the inter-row area IRA may have a width corresponding to the height H of the cover bar 164. Thus, the linear motion range MA of the cover bar 164 may be restricted within the half of the row pitch.

In certain embodiments, the cover bar 164 may be configured to rotate with respect to an edge of the cover bar 164 so that the cover bar 164 blocks the inlet/outlet hole row HR1/HR2 in an interrupt mode and opens the inlet/outlet hole rows HR1/HR2 in a flow mode. In this example, the width of the cover bar 164 may be the same as or greater than the diameter of the holes H and may be greater than the width of the inter-row area IRA. The thickness of the cover bar 164 may be lesser than the width of the inter-row area IRA in this example, thereby fitting in the inter-row area IRA in the flow mode when the cover bar 164 is rotated to open the inlet/outlet holes.

In the present example embodiment, the process chamber 101 may include an inlet hole cover **160*a* and an outlet hole cover 160*b*. However, the process chamber 101 may include just one of the inlet hole cover 160*a* and the outlet hole cover 160*b* according to the requirements of the surface treatment apparatus 500**.

A plurality of the inlet hole covers **160*a* may be movably arranged at a first area 113*a* of the rear wall 113 adjacent to the supply baffle 120 in such a configuration that the inlet hole covers 160*a* may correspond to the inlet hole rows HR1 by one to one. Each inlet hole cover 160*a* may be individually operated irrespective of the other inlet hole covers 160*a*, so that at least one of the inlet hole rows HR1 may be covered by the corresponding inlet hole cover 160*a*. Thus, the process radicals R may be interrupted from flowing into the treatment space TS at predetermined heights of the process chamber 101** in the third direction III.

In the same way, a plurality of the outlet hole covers **160*b* may be movably arranged at a second area 113*b* of the rear wall 113 adjacent to the discharge baffle 130 in such a configuration that the outlet hole covers 160*b* may correspond to the outlet hole rows HR2 by one to one. Each outlet hole cover 160*b* may be individually operated irrespective of the other outlet hole covers 160*b*, so that at least one of the outlet hole rows HR2 may be covered by the corresponding outlet hole cover 160*b*. Thus, the process radicals R may be interrupted from flowing into the discharge buffer space DBS at predetermined heights of the process chamber 101** in the third direction III.

Each inlet hole cover 160*a* may move alternately between the corresponding inlet hole row HR1 and the corresponding inter-row area IRA. When the inlet hole cover 160*a* is positioned on the corresponding inlet hole row HR1, the process radicals R may be prevented from flowing into the treatment space TR from the supply buffer space SBS. In contrast, when the inlet hole cover 160*a* is positioned on the corresponding inter-row area IRA, the process radicals R may be allowed to flow into the treatment space TS from the supply buffer space SBS.

In the same way, each outlet hole cover 160*b* may move alternately between the corresponding outlet hole row HR2 and the corresponding inter-row area IRA. When the outlet hole cover 160*b* is positioned on the corresponding outlet hole row HR2, the process radicals R may be prevented from flowing into the discharge buffer space DBS from the treatment space TS. In contrast, when the outlet hole cover 160*b* is positioned on the corresponding inter-row area IRA, the process radicals R may be allowed to flow into the discharge buffer space DBS from the treatment space TS.

Accordingly, the process radicals R may flow in or out at selective vertical positions in the process chamber 101 according to the characteristics and requirements of the plasma surface treatment process.

For example, the inlet hole cover 160*a* and the outlet hole cover 160*b* may be positioned at the same height H of the body 110 and may be simultaneously operated in the process chamber 100, the inlet hole row HR1 and the outlet hole row HR2 positioning at the same height may be simultaneously closed or opened by the inlet hole cover 160*a* and the outlet hole cover 160*b*. Accordingly, the process radicals R may flow uniformly from the supply buffer space SBS to the discharge buffer space DBS in the second direction II without flow interruption in the process chamber 101. For example, coupling operation of the inlet hole cover 160*a* and the outlet hole cover 160*b* positioned at the same height in the third direction may be helpful for uniform flow of the process radicals R through the treatment space TS of the process chamber 101.

Referring to FIGS. 2 and 5, the holder 140 may be positioned at the bottom of the body 110 and the package structure PS may be secured to the holder 140 in the process chamber 100/101. For example, the package structure PS may be directly or indirectly secured to the holder 140 according to the characteristics of the plasma surface treatment process. In the present example embodiments, the package structure PS may be indirectly secured to the holder 140 in such a way that a plurality of the package structures PS may be stacked in the magazine M and the magazine M may be directly secured to the holder 140, so that the surface treatment process may be simultaneously conducted to the plurality of the package structures PS. Therefore, the holder 140 may include a magazine holder.

Figure 7:
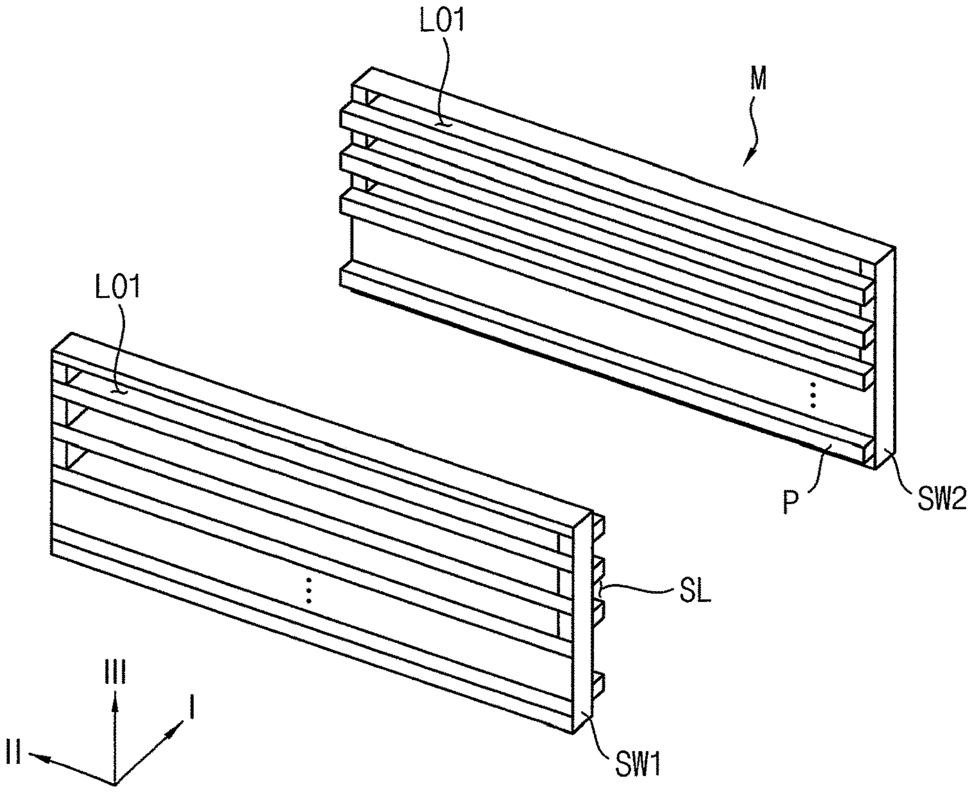
FIG. 7 is a perspective view illustrating the magazine for holding a plurality of package structures shown in FIG. 1 in accordance with an example embodiment of the present inventive concept.

FIG. 7 is a perspective view illustrating the magazine for holding a plurality of package structures shown in FIG. 1 in accordance with an example embodiment of the present inventive concept.

Referring to FIG. 7, the magazine M may include first and second sidewalls SW1 and SW2 extending in the second direction II and spaced apart from each other in the first direction I and a plurality of protrusions P protruding from each of the first and second sidewalls SW1 and SW2.

The protrusions P may be arranged on each inner surface of the first sidewall SW1 and the second sidewall SW2 and may be spaced apart by the same gap in the third direction III. Thus, a slot SL may be provided between the neighboring protrusions P and the package structure PS may be inserted into the slot SL. A peripheral portion of the package structure PS may be positioned on a pair of the protrusions P that may be positioned at the same height.

A plurality of first line openings LO1 may be arranged on an outer surface of the first sidewall SW1 in such a way that the slots SL of the first sidewall SW1 may be communicated with the corresponding first line openings LO1, respectively. In the same way, a plurality of second line openings LO2 may be arranged on an outer surface of the second sidewall SW2 in such a way that the slots SL of the second sidewall SW2 may be communicated with the corresponding second line openings LO2, respectively. The first line openings LO1 may be spaced apart on the outer surface of the first sidewall SW1 by the same gap in the third direction III and may extend in the second direction II. In the same way, the second line openings LO2 may be spaced apart on the outer surface of the second sidewall SW1 by the same gap in the third direction III and may extend in the second direction II. For example, each of the first line openings LO1 may be formed through the first side wall SW1 in the first direction and, each of the second line openings LO2 may be formed through the second sidewall SW2 in the first direction.

For example, the first line openings LO1 may correspond to the inlet hole rows HR1 by one to one at the same height, so the process radicals R flowed into the treatment space TS through the inlet hole rows HR1 may flow into the magazine M through the first line openings LO1, respectively, each of which may be positioned at the same height as a corresponding inlet hole row HR1.

Accordingly, the process radicals R may flow simultaneously on respective package structures PS, which may be placed on respective slots SL in the magazine M, and the package structures PS may simultaneously undergo the plasma surface treatment process in the process chamber 100/101.

When completing the surface treatment process to the package structures PS, the process radicals R may flow out of the magazine through the second line openings LO2. The second line openings LO2 may correspond to the outlet hole rows HR2 by one to one at the same height, so the process radicals R flowed out of the magazine M may flow into the discharge buffer space DBS through the outlet hole rows HR2, respectively, each of which may be positioned at the same height as a corresponding second line opening LO2.

Accordingly, the process radicals R may flow uniformly from the inlet hole rows HR1 to the outlet hole rows HR2 through the magazine M and the package structures PS in the magazine M may be simultaneously under the surface treatment process by the uniform flow of the process radicals R.

For example, when the package structures PS are positioned at some of the slots SL and the rest slots SL are empty in the magazine M, the inlet hole rows HR1 and the outlet hole rows HR2 corresponding to the empty slots SL may be closed by the inlet hole cover 160*a* and the outlet hole cover 160*b*, respectively. Therefore, the process radicals R may flow just into the slots SL in which the package structures PS are disposed and may be focused onto the package substrate PS in the magazine M. In this way, the surface treatment process efficiency may be improved.

Referring again to FIG. 1, the plasma generator 200 may include an electrode 210 for applying an electric power and a plasma chamber 220 holding source gases. The source gases may be formed into the process plasma by the electric power.

The configurations of the electrode 210 may be varied according to the structure of the plasma generator 200. For example, the electrode 210 may include a plurality of coils for generating capacitively coupled plasma or inductively coupled plasma.

A cooling unit 212 may be further provided with the plasma generator 200 to prevent over heat of the electrode 210. For example, the cooling unit 212 may include a cooling cylinder enclosing the electrode 210.

Impurities may be removed from the surfaces of the package structures PS and a plurality of dangling bonds may be generated on the surfaces of the package structures PS by the plasma surface treatment. Thus, the package structures PS may be sufficiently combined with package mold in a subsequent molding process. For that reason, the plasma radicals R may include oxidizing radicals such as oxygen radicals or nitrogen radicals.

The process radicals R may be supplied into the process chamber 100 via the supply duct SD. At least one supply valve V may be provided with the supply duct SD and the flux of the process radicals R may be controlled in the supply duct SD by the supply valve V.

The cooler 300 may enclose the supply duct SD and may cool down the temperature of the process radicals R, so that the process radicals R may be formed into low temperature process radicals R. The low temperature process radicals R may have a process temperature at which the damages to the package structure PS may be minimized in the plasma surface treatment process.

For example, the cooler 300 may include a tube 310 enclosing the supply duct SD and in which a cooling fluid CF may flow, an inlet terminal 320 positioned at a first end 311 of the tube 310 and through which the cooling fluid CF may be supplied into the tube 310 at a temperature lower than that of the process radicals R in the plasma generator 200, and an outlet terminal 330 positioned at a second end 312 of the tube 310 and through which the cooling fluid CF may be discharged from the tube 310.

A cooling circulator 340 may force the cooling fluid CF to flow from the inlet terminal 320 to the outlet terminal 330 via the tube 310. The tube 310 may be shaped into a cylinder enclosing the supply duct SD and the heat transfer may occur between the process radicals R in the supply duct SD and the cooling fluid CF in the tube 310. For example, the inner surface of the tube 310 may contact the outer surface of the supply duct SD. The temperature of the process radicals R generated in the plasma generator 200 may be usually higher than the process temperature of the process chamber 100 due to the plasma generation conditions, and may be reduced to the process temperature by the heat transfer between the process radicals R and the cooling fluid CF while the process radicals R flows through the supply duct SD.

The cooling fluid CF in the outlet terminal 330 may be returned into the inlet terminal 320 by the cooling circulator 340, so the cooling fluid CF may be recycled in the cooler 300. The temperature of the cooling fluid CF may increase after the heat transfer in the tube 310 and may reduce again to or below the process temperature by the cooling circulator 340. In certain embodiments, the cooling fluid CF may be cooled down to a lower temperature than the process temperature before the cooling fluid CF is returned to the inlet terminal 320.

In the present example embodiment, the cooling fluid CF may include one of a cooling water and liquid nitrogen. However, any other coolant may also be used as the cooling fluid CF according to the characteristics of the process radicals R and the process temperature of the surface treatment process.

In an example embodiment, the fluid controller 400 may apply a fluid pressure to supply duct SD, the process chamber 100 and the discharge duct DD, so that the process radicals R may flow from the supply duct SD to the discharge duct DD via the process chamber 100 as a single and/or continuous flow F.

When the process radicals R reach the supply duct SD from the plasma generator 200, the process radicals R may be forced to flow toward the process chamber 100 and the discharge duct DD by the fluid pressure. Thus, the flow of the process radicals R may become a single/continuous flow from the supply duct SD to the discharge duct DD in the surface treatment apparatus 500 by the fluid controller 400.

For example, the fluid controller 400 may include a pressure generator 410 connected to the discharge duct DD and a discharge valve 420 for controlling the flux of the process radicals R in the discharge duct DD.

In the present example embodiment, the pressure generator 410 may include a vacuum generator, e.g., a vacuum pump or a suction pump, for applying a vacuum pressure to the discharge duct DD, and the discharge valve 420 may include a flow control valve.

The package structure PS may include a semiconductor package having a circuit board and at least an IC chip bonded to the circuit board, and the plasma surface treatment process may be conducted to the semiconductor package structure PS in the surface treatment apparatus 500. However, any other structures may also be processed in the surface treatment apparatus 500 as long as the process plasma may be generated at the exterior/outside of the process chamber 100 and may be supplied to the process chamber 100 after reducing to the process temperature. For example, the plasma surface treatment process may be conducted to a flat panel structure for a display device in the surface treatment apparatus 500.

According to the present example embodiment of the surface treatment apparatus, the process plasma may be generated at an exterior/outside of the process chamber 100 and may be supplied to the process chamber 100 via the supply duct SD with the process temperature at a controlled flow rate. The temperature of the process radicals R may be reduced to the process temperature by the coolant enclosing the supply duct SD, to thereby minimize the damages to the package structure PS in the plasma surface treatment process. For example, the temperature and the flux of the process radicals R may be accurately controlled for minimizing damages to the package structure PS in the plasma surface treatment process.

The supply baffle 120 may be arranged in the process chamber 100 for the process radicals R pass through the supply baffle 120 after passing through the supply duct SD and a plurality of the inlet hole rows HR1 is arranged in the supply baffle 120 with the same gap along the height of the process chamber 100, so that the process radicals R may be supplied into the treatment space TS of the process chamber 100 uniformly along the height of the process chamber 100. In addition, the discharge baffle 130 may be arranged in the process chamber 100 for the process radicals R pass through the discharge baffle 130 before passing through the discharge duct DD and a plurality of the outlet hole rows HR2 is arranged with the same gap along the height of the process chamber 100, so that the process radicals R may be discharged from the treatment space TS of the process chamber 100 uniformly along the height of the process chamber 100. Therefore, the plasma surface treatment process may be uniformly and simultaneously conducted to a plurality of the package structures PS in the process chamber 100.

Figure 8:
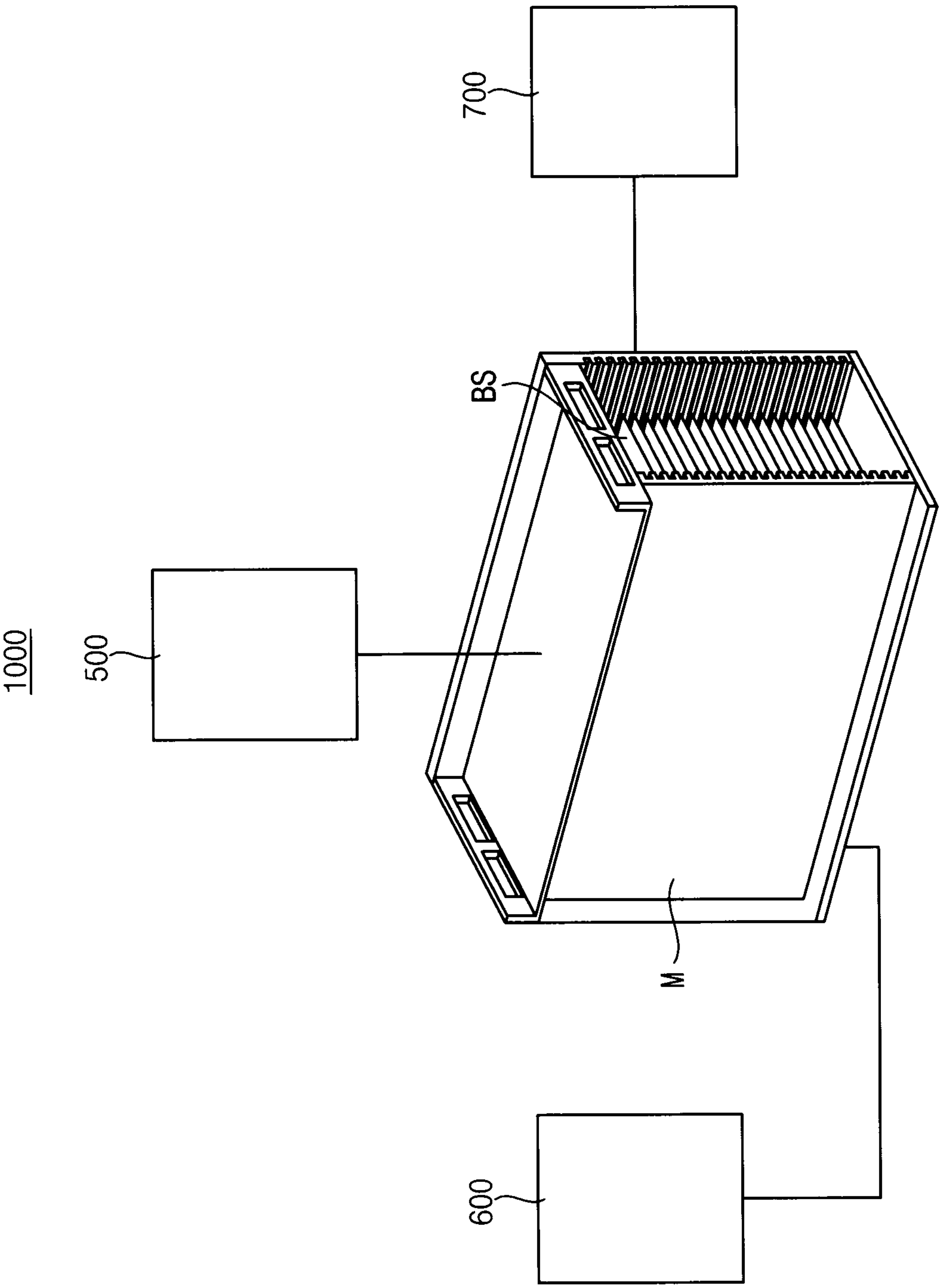
FIG. 8 is a structural view illustrating a structure of a surface treatment system including the surface treatment apparatus shown in FIG. 1.

FIG. 8 is a structural view illustrating a surface treatment system including the surface treatment apparatus shown in FIG. 1.

Referring to FIG. 8, a surface treatment system 1000 in accordance with an example embodiment of the present inventive concept may include a bonding apparatus 600 for bonding an IC chip C to a circuit board B to thereby forming the package structure PS, a surface treatment apparatus 500 for conducting a plasma surface treatment process to the package structure PS and a molding apparatus 700 for forming a mold structure on the circuit board B and the IC chip C and encapsulating the IC chip, thereby protecting the IC chip C and the circuit board B from surroundings.

An IC chip C may be bonded to the circuit board B in the bonding apparatus 600 and the package structure PS may be formed in the bonding apparatus 600. For example, each of the package structures PS may comprise a circuit board B and one or more IC chips C mounted on the circuit board B. In certain embodiments, a package structure PS may include multiple circuit boards B stacked vertically and/or arranged horizontally.

A semiconductor substrate (not shown) such as a wafer on which a plurality of the IC chips may be formed may be transferred into the bonding apparatus 600. Then, the IC chips on the semiconductor substrate may be formed into an individual chip (usually referred to as die) by a dicing process, and every die may be picked up individually and be mounted on the circuit board B by using a picker assembly. For example, the circuit board B may include a printed circuit board (PCB).

Then, a heat treatment may be conducted to the circuit board B on which the IC chip C may be mounted in such a way that bonding pads of the circuit board B may be bonded to contact member of the IC chip C, thereby forming the package structure PS. For example, the contact member of the IC chip C may include a bump structure such as a micro bump and a minute mounting gap MG may be formed between the IC chip C and the circuit board B.

Then, the package structure PS having the minute mounting gap MG may be unloaded from the bonding apparatus 600 and may be loaded in the magazine M. A plurality of the slots SL may be provided in the magazine M and the package structure PS may be inserted into a slot SL of the magazine M. For example, a plurality of package structures PS may be mounted in the plurality of slots SL of the magazine M. When a predetermined number of the package structures PS are stacked in the magazine M, the magazine M may be transferred to the surface treatment apparatus 500.

The magazine M may be directly loaded into the treatment space TS of the process chamber 100 of the surface treatment apparatus 500. When the magazine M is secured to the holder 140, the process radicals R may be generated in the plasma generator 200 and the fluid pressure may be applied to the discharge duct DD, the process chamber 100 and the supply duct SD. Then, the process radicals R may flow into the process chamber 100 via the supply duct SD and may flow out from the process chamber 100 via the discharge duct DD with a single/continuous flow. The temperature of the process radicals R may be reduced to the process temperature by the cooler 200, so that a low/controlled temperature plasma having a predetermined temperature may be supplied into the process chamber 100.

The low temperature process radicals R may be supplied into the treatment space TS uniformly along the height of the process chamber 100 by using the supply baffle 120. The supply baffle 120 may include a plurality of inlet hole rows HR1 that may be arranged at the same gap along the vertical direction of the process chamber 100. Thus, the plasma surface treatment process may be uniformly conducted to all package structures PS that are stacked along the height/vertical direction of the process chamber 100 in the magazine M.

Then, the process radicals R may be discharged from the process chamber 100 through the discharge duct DD. The discharge baffle 130 may be arranged between the magazine M and the discharge duct DD and a plurality of outlet hole rows HR2 may be arranged in correspondence with the inlet hole rows HR1, respectively, so that the process radicals R may be discharged from the process chamber 100 without flow interruption.

Since the temperature of the process radicals R may be sufficiently reduced to the process temperature, the IC chip C and the circuit board B may not be damaged in the plasma surface treatment process in spite of the minute mounting gap MG between the IC chip C and the circuit board B.

For example, when a minute gap MG is formed between an IC chip C and a circuit board B on which the IC chip C is mounted, it may take longer time or may need a stronger plasma to treat surfaces of the IC chip and the circuit board B facing the minute gap thereby damaging certain portions of the IC chip and/or the circuit board B. However, when the plasma temperature is low enough, the IC chip and the circuit board B may not be damaged while surfaces facing the minute gap and/or in the vicinity of the minute gap are treated by the plasma, which is the case of the embodiments in the present disclosure.

The surface treatment apparatus 500 may have substantially the same structures as the surface treatment apparatus 500 describe in detail with references to FIGS. 1 to 7. Thus, any further detailed descriptions on the surface treatment apparatus 500 will be omitted.

Impurities may be sufficiently removed from the surface of the package structures PS and dangling bonds may be sufficiently generated on the surface of the package structures by the plasma surface treatment process in the surface treatment apparatus 500.

Then, the package structures PS may be unloaded from the surface treatment apparatus 500 and may be loaded into the molding apparatus 700. For example, the package structures PS may be individually unloaded from the magazine M and may be loaded to another magazine M configured to transfer the package structures PS to the molding apparatus 700.

A plurality of the package structures PS may be stacked again in the magazine M after the plasma surface treatment process, and the magazine M may be transferred to the molding apparatus 700. In certain embodiments, the package structures PS may be unloaded from the surface treatment apparatus 500 along with the magazine M and the magazine M itself along with the package structures PS loaded in the magazine M may be transferred to the molding apparatus 700. Each package structure PS may be picked up from the magazine M and may be individually loaded into the molding apparatus 700.

A mold structure (not shown) may be formed on the circuit board B in such a way that the IC chip C may be covered by the mold structure and the IC chip may be secured to the circuit board B by the mold structure. The mold structure may function as an encapsulant for protecting the IC chip from surroundings. Since the impurities may be sufficiently removed from the package structure PS and a plurality of the dangling bonds may exist on the package structure PS, the mold structure may be sufficiently combined to the IC chip C and the circuit board B. Thus, the package structure PS may be formed into a semiconductor package in the molding apparatus 700.

Then, a plurality of the semiconductor packages may be stacked again in the magazine M and the magazine M may be transferred to another packaging process.

The magazine M may be transferred between the bonding apparatus 600, the surface treatment apparatus 500 and the molding apparatus 700 by using various transfers such as a hanger. For example, the magazines M transferring the semiconductor packages and/or the package structures PS between processes may be different from the magazine M used during processes. For example, the magazine M used in the surface treatment apparatus 500 during the surface treatment process may be different from the other magazines M used to transfer the package structures PS and/or semiconductor packages.

According to the embodiments, the mold structure and the package structure PS may be sufficiently combined with each other and detachment defect between the IC chip C and the circuit board B may be minimized and the operation defect of the semiconductor package may be reduced in spite of the minute mounting gap MG between the IC chip C and the circuit board B.

Figure 9:
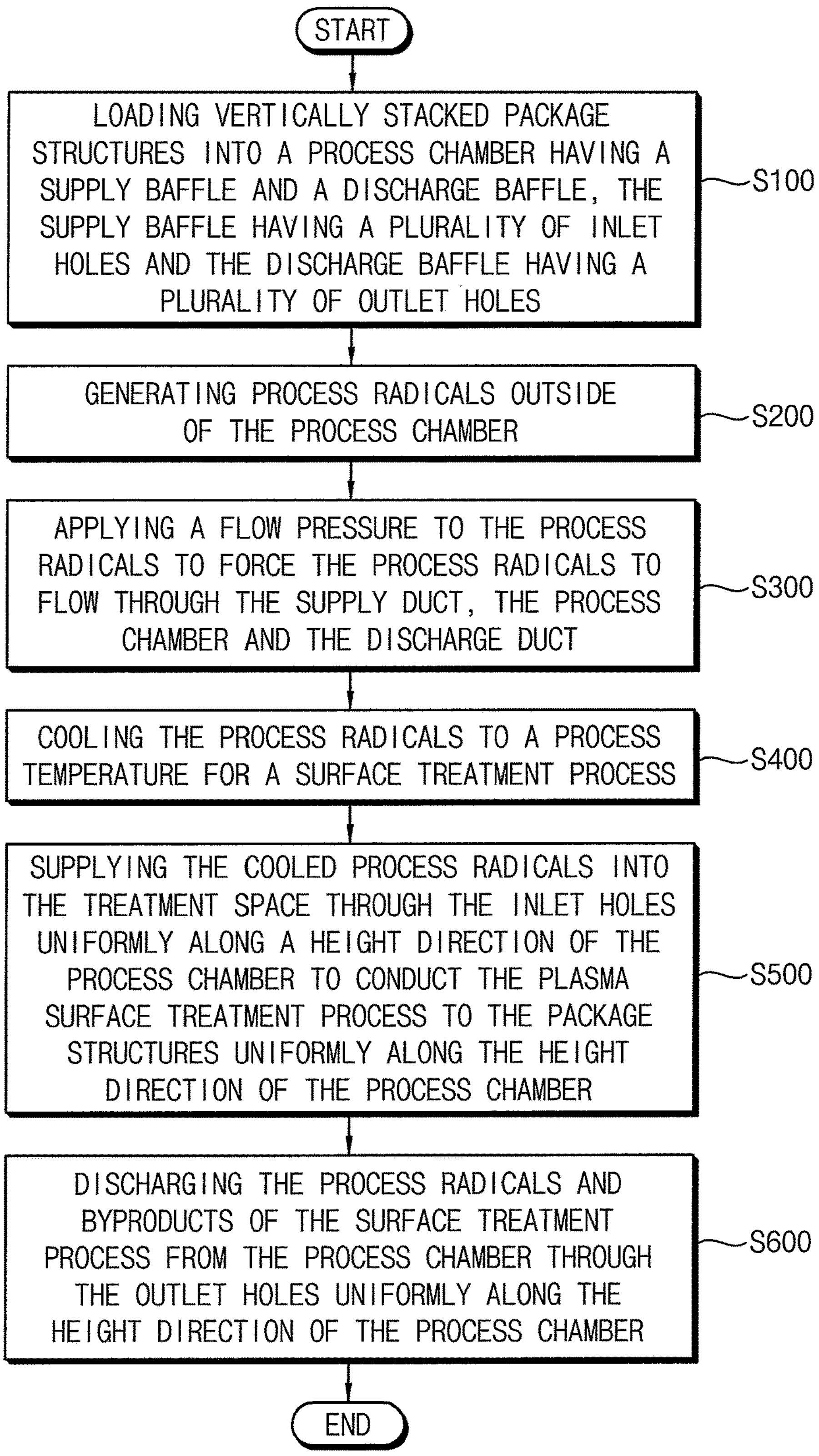
FIG. 9 is a flow chart showing processing steps for a method of conducting a plasma surface treatment process in the surface treatment apparatus shown in FIGS. 1 to 7.

FIG. 9 is a flow chart showing processing steps for a method of conducting a plasma surface treatment process in the surface treatment apparatus shown in FIGS. 1 to 7. For example, FIG. 9 illustrates certain steps of a method of manufacturing a semiconductor device and/or an electronic device.

As used herein, a semiconductor device may refer to any of the various devices such as molded package structures described above, and may also refer, for example, to two transistors or a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices.

An electronic device, as used herein, may refer to these semiconductor devices, but may additionally include products that include these devices, such as a memory module, memory card, hard drive including additional components, or a mobile phone, laptop, tablet, desktop, camera, or other consumer electronic device, etc.

Referring to FIGS. 1 to 7 and 9, the package structure PS may be loaded into the process chamber 100 (step S100). Particularly, the package structure PS may be loaded into the treatment space TS defined by the supply baffle 120 and the discharge baffle 130.

In the present example embodiment, a plurality of the package structures PS may be stacked in the magazine M and the magazine M itself may be loaded into the treatment space TS and be secured to the holder 140 in the process chamber 100.

The first wall 111 of the process chamber 100 may be connected to the supply duct SD and the supply baffle 120 may be positioned opposite to the supply duct SD with respect to the first wall 111 in the process chamber 100. A plurality of the inlet holes H1 may be arranged in the supply baffle 120 as a plurality of inlet hole rows HR1 that may be spaced apart by the same gap in the height direction of the process chamber 100. The second wall 112 of the process chamber 100 may be connected to the discharge duct DD and the discharge baffle 130 may be positioned opposite to the discharge duct DD with respect to the second wall 112 in the process chamber 100. A plurality of the outlet holes H2 may be arranged in the discharge baffle 130 as a plurality of outlet hole rows HR2 that may be spaced apart by the same gap in the height direction of the process chamber 100.

The process chamber 100 may be divided into the supply buffer space SBS defined by the first wall 111 and the supply baffle 120, the discharge buffer space DBS defined by the second wall 112 and the discharge baffle 130 and the treatment space TS defined by the supply baffle 120 and the discharge baffle 130.

Then, the process plasma for the plasma surface treatment process may be generated in the plasma generator 200 that may be positioned at an exterior/outside of the process chamber 100 (step S200).

For example, the process radicals may be generated in the plasma generator 200 that may be connected to the supply duct SD. For example, oxygen radicals or nitrogen radicals may be generated as the process radicals R.

Then, the flow pressure may be applied to the discharge duct DD, the process chamber 100 and the supply duct SD so as to force the process radicals R to flow in the surface treatment apparatus 500 as a single/continuous flow (step S300).

For example, a vacuum pressure may be applied to the discharge duct DD by the fluid controller 400 and the supply duct SD may be opened by the supply valve V. Then, the process radicals R may flow into the process chamber 100 through the supply duct SD and flow out of the process chamber 100 through the discharge duct DD.

In such a case, a sufficiently low vacuum pressure may be simultaneously applied to the supply duct SD, the process chamber 100 and the discharge duct DD, so that the process radicals R may be formed into a single/continuous flow through the supply duct SD to the discharge duct DD. In spite of the plasma state, the process radicals R may move as a directional single/continuous flow in the surface treatment apparatus 500. For example, the single/continuous flow may be a flow having minimized eddy flow and/or minimized reverse flow.

The process radicals R may be cooled down to the process temperature when the process radicals R passes through the supply duct SD (step S400).

For example, the cooling fluid CF may flow in the cooler 300 enclosing/surrounding the supply duct SD and the heat transfer may occur between the process radicals R and the cooling fluid CF in the cooler 300. Thus, the process radicals R may be cooled down to be the low temperature process radicals by the cooler 300. For example, the cooling fluid CF may include cooling water and/or liquid nitrogen.

In the present example embodiment, the temperature of the process radicals R may be reduced to the process temperature at which damages to the IC chip C and the circuit board B may be minimized.

When the temperature of the process radicals R is sufficiently reduced to the process temperature of the plasma surface treatment process, the low temperature process radicals R may be uniformly diffused into the treatment space TS of the process chamber 100. Thus, the plasma surface treatment process may be uniformly conducted to each of the package structures PS that are stacked in the magazine M along the height direction of process chamber 100 (step S500).

The low temperature process radicals R, e.g., cool radicals, may be supplied into the supply buffer space SBS and may be uniformly supplied into the treatment space TS through the inlet hole rows HR1. Thus, the cool radicals may be diffused uniformly along the height direction of the process chamber 100.

For example, the inlet hole rows HR1 may correspond to the slots SL of the magazine M by one to one at the same height, so the process radicals R may flow into the magazine M uniformly along the height of the process chamber 100. Accordingly, the plasma surface treatment process may be uniformly conducted to all package structures PS vertically stacked in the magazine M.

When completing the surface treatment process to all package structures PS in the magazine M, the process radicals R and the byproducts of the surface treatment process may be discharged from the process chamber 100 through the discharge duct DD (step S600).

Since the vacuum pressure may be simultaneously applied to the process chamber 100 and the discharge duct DD, the process radicals R and the byproducts of the surface treatment process may flow into the discharge duct DD.

The process radicals R and the byproducts in the treatment space TS may flow into the discharge buffer space DBS through the outlet hole rows HR2 and may be stored/gathered in the discharge buffer space DBS. Since the outlet hole rows HR2 are positioned at the same height as the inlet hole rows HR1, the flow of the process radicals R may be uniform from the supply baffle 120 to the discharge baffle 130 without flow interruption in the process chamber 100. Thus, the process radicals R and the byproducts may flow into the discharge buffer space DBS uniformly along the height of the process chamber 100.

According to an example embodiment of the surface treatment process, a low temperature process radicals R may be supplied into the process chamber 100 at an amount sufficiently conducting the surface treatment process to surfaces of the minute mounting gap MG of the package structure PS. Thus, the surfaces of the package structure PS having the minute mounting gap MG may be sufficiently treated by the plasma surface treatment process without substantial damages to the IC chip C and the circuit board B.

According to the example embodiments of the present inventive concept, the process plasma may be generated at an exterior/outside of the process chamber 100 and may be supplied to the process chamber 100 via the supply duct SD with a controlled process temperature and at a controlled flow rate sufficiently for treating the surfaces of the minute mounting gap MG. The temperature of the process radicals R may be reduced to the process temperature by the coolant flowing through the cooler 300 enclosing/surrounding the supply duct SD, to thereby minimize the damages to the package structure PS in the plasma surface treatment process. The temperature and the flux of the process radicals R may be accurately controlled for minimizing damages to the package structure PS in the plasma surface treatment process.

For example, the low temperature process radicals R may be supplied into the process chamber 100 at an amount sufficiently conducting the surface treatment process to surfaces of the minute mounting gap MG of the package structure PS. Thus, the surfaces of the package structure PS having the minute mounting gap MG may be sufficiently treated by the plasma surface treatment process without substantial damages to the IC chip C and the circuit board B.

The supply baffle 120 may be arranged around/near the supply duct SD in the process chamber 100 and a plurality of the inlet hole rows HR1 is arranged at the same gap/distance between the inlet hole rows HR1 along the height of the process chamber 100, so that the process radicals R may be supplied into the treatment space TS of the process chamber 100 uniformly along the height of the process chamber 100. The discharge baffle 130 may be arranged around/near the discharge duct DD in the process chamber 100 and a plurality of the outlet hole rows HR2 is arranged at the same gap/distance between the outlet hole rows HR2 along the height of the process chamber 100, so that the process radicals R may be discharged from the treatment space TS of the process chamber 100 uniformly along the height of the process chamber 100. Therefore, the plasma surface treatment process may be uniformly and simultaneously conducted to a plurality of the package structures PS in the process chamber 100.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing a semiconductor device, comprising:

loading a plurality of package structures to a process chamber having first and second walls spaced apart in a first direction and a supply baffle and a discharge baffle adjacent to the first and the second walls, respectively, the supply and discharge baffles extending in a second direction perpendicular to the first direction, the supply baffle having a plurality of inlet holes and the discharge baffle having a plurality of outlet holes;

after loading the plurality of package structures, selectively opening and closing the plurality of inlet holes and the plurality of outlet holes;

supplying process radicals generated from an exterior plasma generator into the process chamber through the inlet holes to thereby conduct a plasma surface treatment process to surfaces of the package structures with the process radicals; and discharging the process radicals from the process chamber through the outlet holes, wherein the package structures are stacked in a third direction perpendicular to the first and second directions while the plasma surface treatment process is performed, wherein the plurality of inlet holes include a plurality of inlet hole rows, wherein the plurality of outlet holes include a plurality of outlet hole rows, and wherein selectively opening and closing the plurality of inlet holes and the plurality of outlet holes include simultaneously opening and closing the inlet hole rows and the outlet hole rows positioned at a same height.

2. The method of claim 1, wherein the first wall of the process chamber is connected to a supply duct and the supply baffle is positioned opposite to the supply duct with respect to the first wall in the process chamber.

3. The method of claim 2, wherein a temperature of the process radicals is reduced to a process temperature of the plasma surface treatment process before the process radicals are supplied into the process chamber.

4. The method of claim 3, wherein a cooling fluid flows in a cooler enclosing/surrounding the supply duct and a heat transfer occurs between the process radicals and the cooling fluid in the cooler.

5. The method of claim 2, wherein the plurality of the inlet holes is arranged in the supply baffle as a plurality of inlet hole rows being spaced apart by a same gap in the third direction of the process chamber.

6. The method of claim 5, wherein the second wall of the process chamber is connected to a discharge duct and the discharge baffle is positioned opposite to the discharge duct with respect to the second wall in the process chamber.

7. The method of claim 6, wherein the plurality of the outlet holes is arranged in the discharge baffle as a plurality of outlet hole rows being spaced apart by a same gap in the third direction of the process chamber.

8. The method of claim 6, wherein a vacuum pressure is applied to the discharge duct, the supply duct is opened, and the process radicals flows into the process chamber through the supply duct and flows out of the process chamber through the discharge duct.

9. The method of claim 8, wherein the vacuum pressure is simultaneously applied to the supply duct, the process chamber and the discharge duct so that the process radicals are formed into a single/continuous flow through the supply duct to the discharge duct.

10. A method of manufacturing a semiconductor device, comprising:

loading a plurality of package structures to a process chamber having first and second walls spaced apart in a first direction and a supply baffle and a discharge baffle adjacent to the first and the second walls, respectively, the supply and discharge baffles extending in a second direction perpendicular to the first direction, the supply baffle having a plurality of inlet holes and the discharge baffle having a plurality of outlet holes;

supplying process radicals generated from an exterior plasma generator into the process chamber through the inlet holes to thereby conduct a plasma surface treatment process to surfaces of the package structures with the process radicals; and discharging the process radicals from the process chamber through the outlet holes, wherein the package structures are stacked in a third direction perpendicular to the first and second directions while the plasma surface treatment process is performed, wherein a heat exchanger is arranged on a supply duct and configured to cool down a temperature of the process radicals passing through the supply duct, wherein a flow controller is configured to control the process radicals to flow out of the process chamber, the flow controller being connected to a discharge duct configured that the process radicals are discharged outside the process chamber through the discharge duct, wherein the supply baffle includes a plurality of inlet hole rows within the process chamber, each of the plurality of inlet hole rows including the plurality of the inlet holes arranged in a horizontal direction, wherein the discharge baffle includes a plurality of outlet hole rows within the process chamber, each of the plurality of outlet hole rows including the plurality of the outlet holes arranged in the horizontal direction, wherein a first inlet hole cover is configured to open and close a corresponding inlet hole row, the first inlet hole cover includes a first cover driver and a first cover bar, and the first cover driver is configured to move the first cover bar, wherein a first outlet hole cover is configured to open and close a corresponding outlet hole row, the first outlet hole cover includes a second cover driver and a second cover bar, and the second cover driver is configured to move the second cover bar, wherein the first inlet hole cover and the first outlet hole cover are positioned at the same height and configured to be simultaneously operated to simultaneously open or close the corresponding inlet and outlet hole rows, wherein a treatment space of the process chamber is defined between the supply baffle and the discharge baffle, and wherein each of the plurality of outlet hole rows is positioned at the same height as a corresponding one of the plurality of inlet hole rows for the process radicals to flow uniformly along a height from the supply baffle to the discharge baffle.

11. The method of claim 10, wherein the process chamber includes:

a body having the first wall and the second wall spaced apart from each other in the first direction and extending in the second direction perpendicular to the first direction and a rear wall extending in the first direction and connected to both of rear end portions of the first wall and the second wall at a rear portion, the first wall being connected to the supply duct and the second wall being connected to the discharge duct;

the supply baffle positioned in the body near the supply duct such that the supply baffle is spaced apart from the first wall and a supply buffer space is defined by the first wall and the supply baffle;

the discharge baffle positioned in the body near the discharge duct such that the discharge baffle is spaced apart from the second wall and a discharge buffer space is defined by the second wall and the discharge baffle; and a holder positioned at a bottom of the body and configured to secure the package structures.

12. The method of claim 11, wherein the body includes a gate at a front portion opposite to the rear portion such that the treatment space defined by the supply baffle and the discharge baffle is selectively closed or opened by the gate for loading and unloading the package structures into/from the treatment space.

13. The method of claim 10, wherein the first wall of the process chamber is connected to the supply duct and the supply baffle is positioned opposite to the supply duct with respect to the first wall in the process chamber.

14. The method of claim 13, wherein the plurality of the inlet holes is arranged in the supply baffle as the plurality of the inlet hole rows being spaced apart by a same gap in the third direction of the process chamber.

15. The method of claim 14, wherein the second wall of the process chamber is connected to the discharge duct and the discharge baffle is positioned opposite to the discharge duct with respect to the second wall in the process chamber.

16. The method of claim 15, wherein the plurality of the outlet holes is arranged in the discharge baffle as the plurality of the outlet hole rows being spaced apart by a same gap in the third direction of the process chamber.

17. The method of claim 10, wherein a vacuum pressure is applied to the discharge duct, the supply duct is opened, and the process radicals flows into the process chamber through the supply duct and flows out of the process chamber through the discharge duct.

18. The method of claim 17, wherein the vacuum pressure is simultaneously applied to the supply duct, the process chamber and the discharge duct so that the process radicals are formed into a single/continuous flow through the supply duct to the discharge duct.

19. The method of claim 10, wherein a temperature of the process radicals is reduced to a process temperature of the plasma surface treatment process before the process radicals are supplied into the process chamber.

20. The method of claim 19, wherein a cooling fluid flows in a cooler enclosing/surrounding the supply duct and a heat transfer occurs between the process radicals and the cooling fluid in the cooler.

* * * * *